United States Patent [19]

Partovi et al.

[11] Patent Number: 4,857,770
[45] Date of Patent: Aug. 15, 1989

[54] OUTPUT BUFFER ARRANGEMENT FOR REDUCING CHIP NOISE WITHOUT SPEED PENALTY

[75] Inventors: Hamid Partovi, Westborough, Mass.; Michael A. Van Buskirk, San Jose, Calif.

[73] Assignee: Advanced Micro Devices, Inc., Sunnyvale, Calif.

[21] Appl. No.: 161,810

[22] Filed: Feb. 29, 1988

[51] Int. Cl.$^4$ ............... H03K 19/017; H03K 19/094; H03K 3/01
[52] U.S. Cl. .................................. 307/451; 307/448; 307/296.1; 307/296.8; 307/443
[58] Field of Search ........... 307/443, 448, 451, 296 R, 307/297

[56] References Cited

U.S. PATENT DOCUMENTS 4,301,380 11/1981 Thomas ........................... 307/297

FOREIGN PATENT DOCUMENTS 0223267 5/1987 European Pat. Off. ............ 307/475

Primary Examiner—Stanley D. Miller
Assistant Examiner—Margaret Rose Wanbach
Attorney, Agent, or Firm—Davis Chin

[57] ABSTRACT

An output buffer arrangement includes a first stable, controlled current source (MO1), a first bidirectional-switching device (24) including a CMOS transmission gate and being responsive to the first current source (MO1) for charging the gate of a pull-up transistor (MO5), a second stable, controlled current source (MO6), and a second bidirectional-switching device (27) including a second CMOS transmission gate and being responsive to the second current source (MO6) for charging the gate of a pull-down transistor (MO10). The output buffer arrangement reduces induced chip noise at low temperature, high power supply voltage without degrading substantially its high operational speed.

17 Claims, 3 Drawing Sheets

OUTPUT BUFFER ARRANGEMENT FOR REDUCING CHIP NOISE WITHOUT SPEED PENALTY

BACKGROUND OF THE INVENTION

This invention relates generally to output buffer circuits and more particularly, it relates to an improved output buffer arrangement for reducing induced chip noise at low temperature, high power supply voltage without degrading substantially its high operational speed.

In present day technology, digital logic circuits are widely used in the electronics field. One such use is for the interfacing between the logic of one integrated circuit device and another integrated circuit device. An output buffer circuit is an important component for this interface function. The output buffer provides, when enabled, an output signal which is a function of a data input signal received from other logic circuitry of the integrated circuit.

One of the problems associated with such output buffer circuits is their generation of power supply noise due to very fast switching speed. There have been attempts made in the prior art to relieve or solve the noise problem by a general slowing down of the output stage transistors in the output buffers. However, these solutions have the disadvantage of causing speed deterioration at slow bias conditions (i.e., low power supply voltage, hot temperatures, and slow process corners).

It would therefore be desirable to provide an improved output buffer arrangement for reducing induced chip noise at fast bias conditions comparable to conventional output buffer circuits but yet retains high operational speeds at slow bias conditions. The output buffer arrangement of the present invention provides a P-channel gate bias potential, which varies favorably with temperature, power supply voltage and process so as to yield well-controlled current sources, for controlling the switching speed of the output stage transistors in order to limit excessive noise.

SUMMARY OF THE INVENTION

Accordingly, it is a general object of the present invention to provide an improved output buffer arrangement which is relatively simple and economical to manufacture and assemble, but yet overcomes the disadvantages of the prior art buffers.

It is an object of the present invention to provide an improved output buffer arrangement for reducing induced chip noise at fast bias conditions comparable to conventional output buffer circuits but yet retains high operational speeds at slow bias conditions.

It is another object of the present invention to provide an improved output buffer arrangement which includes driver stage means for generating stable, controlled current sources to charge up the gates of the pull-up and pull-down transistors in an output stage.

It is still another object of the present invention to provide an improved output buffer arrangement which includes controlled current source means and bidirectional-switching means including CMOS transmission gates responsive to the current source means for charging the gates of pull-up and pull-down transistors in an output stage.

It is yet still another object of the present invention to provide a reference generator for generating a P-channel gate bias potential which varies favorably with temperature, supply voltage and process to yield a well controlled current source.

In accordance with these aims and objectives, the present invention is concerned with the provision of an improved output buffer circuit for reducing induced chip noise at low temperature and high power supply voltage and having a high operational speed. The output buffer circuit includes an output stage and a driver stage. The output stage is formed of a pull-up transistor and a pull-down transistor. The driver stage includes a first controlled current source, a first bidirectional-switching device, a second controlled current source, and a second bidirectional-switching device. The first bidirectional-switching device includes a first COMS transmission gate and is responsive to the first current source for charging the gate of the pull-up transistor. The second bidirectional-switching device includes a second CMOS transmission gate and is responsive to the second current source for charging the gate of the pull-down transistor.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

To clarify the background of the present invention, it should be understood that a conventional semiconductor integrated circuit used as an output buffer includes generally a driver stage and an output stage. The output stage is formed of a pull-up transistor device and a pull-down transistor device connected together at an output node for driving a load. Upon receiving a data input signal, the driver stage produces a driving signal to drive the output stage. Typically, the driving signal must first charge up gate capacitances associated with the pull-up and pull-down devices before the output buffer is suitable for driving the load. Thus, the switching speed of the output stage is dependent upon the charging current (driving signal) from the driver stage. This is because the dI/dt of the output stage transistors is proportional to dVg/dt of the output stage transistors and is equal to the charging current ICH divided by the Cg of the output stage transistors.

One of the problems that has been encountered with the charging current is the variation of the same due to changes in ambient temperature, variations in power supply voltage and tolerances in the process parameters in massproduced semiconductor MOS integrated circuits (i.e., channel width, channel length, and thickness of gate oxide layer). It has also been found that there is a trade-off between higher switching speeds and noise. In other words, the fast bias conditions of low temperature and high power supply voltage yields the higher operating speeds but also produces the worst case for noise. On the other hand, the slow bias condition of high temperature and low power supply voltage has a reduced amount of noise level, but also has a deterioration in operating speed. Therefore, it is generally known that a circuit must be designed to meet the speed criteria at the slow bias and process conditions. In addition, it has been learned that fast bias and process conditions also yield more noise.

The present invention was achieved by the inventors through a study of the above characteristics in which they discovered that a well controlled charging current could be achieved by a P-channel MOS transistor whose gate is controlled by a bias voltage, which varies favorably with temperature, power supply voltage and process, for controlling the switching speed of the output stage transistors in order to limit excessive noise. Further, it was discovered that a transient switch is required through which the gate bias voltage can be used to control the gate charging characteristics of the output stage transistors.

Figure 1:
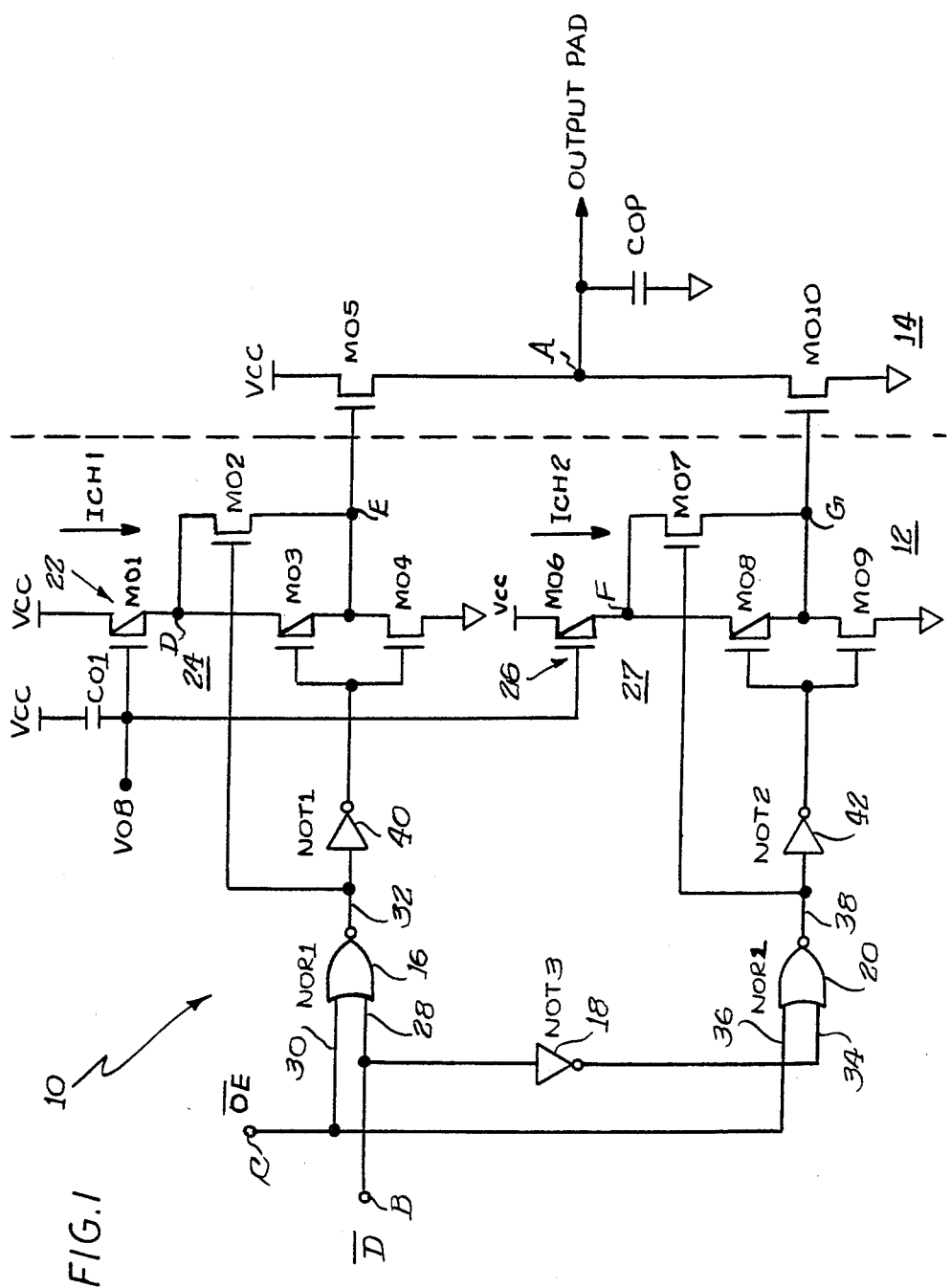
FIG. 1 is a schematic circuit diagram of an output buffer arrangement constructed in accordance with the principles of the present invention.

Referring now in detail to FIG. 1 of the drawings, there is shown a schematic circuit diagram of an output buffer arrangement 10 constructed in accordance with the principles of the present invention. The output buffer arrangement 10 includes a driver stage 12 and an output stage 14. The output stage 14 is formed of a pull-up N-channel MOS transistor MO5 and a pull-down N-channel MOS transistor MO10. The transistor MO5 has its drain connected to a power supply voltage or potential VCC, which is typically at +5.0 volts, and its source connected to the drain of the transistor MO10 and to an output node A. The transistor MO10 has its drain also connected to the output node A and its source connected to a ground potential. A capacitive load represented by a capacitance COP is connected between the output node A and the ground potential. The output buffer arrangement 10 receives a data input signal $\overline{D}$ on input node B and an enable signal $\overline{OE}$ on an input node C.

The driver stage 12 includes a first NOR logic gate 16, a first inverter 18, a second NOR logic gate 20, a first stable controlled current source 22, a first bidirectional-switch 24, a second stable controlled current source 26, and a second bidirectional-switch 27. The first NOR logic gate 16 receives the data input signal $\overline{D}$ on its one input on line 28 and receives the enable signal $\overline{OE}$ on its other input on line 30. The output of the first NOR logic gate 16 on line 32 provides a first control signal. The second NOR logic gate 20 receives the same data input signal $\overline{D}$ on its one input on line 34 via the first inverter 18 and receives the same enable signal $\overline{OE}$ on its other input on line 36. The output of the second NOR gate 20 on line 38 provides a second control signal.

The first controlled current source 22 is formed of a P-channel MOS transistor MO1 having its source connected to the supply potential VCC, its gate connected to a bias voltage $V_{OB}$, and its drain connected to the input of the bidirectional-switch 24. The bias voltage $V_{OB}$ is generated from a reference generator, which will be explained in detail hereinafter. The switch 24 is formed of a first CMOS transmission gate consisting of an N-channel MOS transistor MO2 and a P-channel MOS transistor MO3. The transistor MO2 has its drain connected to the source of the transistor MO3 at a signal input node D and has its source connected to the drain of the transistor MO3 at a signal output node E. The signal input node D is joined to the drain of the first current source transistor MO1, and the signal output node E is joined to the gate of the pull-up transistor MO5. The transistor MO2 has its gate connected to the output of the first NOR logic gate 16. The transistor MO3 has its gate connected to the output of the first NOR gate 16 through the delay of a second inverter 40. An N-channel MOS transistor MO4 has its gate connected to the output of the second inverter 40, its drain connected to the signal output node E and its source connected to the ground potential.

Similarly, the second controlled current source 26 is formed by a P-channel MOS transistor MO6 having its source connected to the supply potential VCC, its gate connected also to the bias voltage $V_{OB}$, and its drain connected to the input of the bidirectional-switch 27. The switch 27 is formed of a second CMOS transmission gate consisting of an N-channel MOS transistor MO7 and a P-channel MOS transistor MO8. The transistor MO7 has its drain connected to the source of the transistor MO8 at a signal input node F and has its source connected to the drain of the transistor MO8 at a signal output node G. The signal input node F is also joined to the drain of the second current source transistor MO6, and the signal output node G is also joined to the gate of the pull-down transistor MO10. The transistor MO7 has its gate connected to the output of the second NOR logic gate 20. The transistor MO8 has its gate connected to the output of the second NOR logic gate 20 via the delay of a third inverter 42. An N-channel MOS transistor MO9 has its gate connected to the output of the third inverter 42, its drain connected to the signal output node G and its source connected to the ground potential.

The bias voltage $V_{OB}$ is used to bias the transistors MO1 and MO6 in saturation and thus provides controlled currents ICH1 and ICH2 for charging the gate capacitances of the pull-up and pull-down transistors MO5 and MO10, respectively. The first and second CMOS transmission gates function as transient switches so as to enable the controlled currents ICH1 and ICH2 to charge up the corresponding gate capacitances since they exhibit a very low transient impedance. A capacitor CO1 is connected between the supply potential VCC and the gates of the transistors MO1 and MO6 so as to stabilize their gate drive under high frequency noise conditions.

During a pull-up condition when the data input signal $\overline{D}$ is making a high-to-low transition with the enable signal $\overline{OE}=0$, the first control signal at the output of the first NOR logic gate 16 will make a low-to-high transition. As a result, the transistor MO2 will be turned on before the transistor MO4 is turned off. This causes the drain of the first current source transistor MO1 to be pulled to the ground potential which biases it in deep saturation. At this point, the P-channel transistor MO3 is still turned off and the N-channel transistor MO2 has a very low impedance. Therefore, the initial charging of the gate capacitance of the pull-up transistor MO5 is done through the N-channel transistor MO2. After the delay by the second inverter 40, the N-channel transistor MO4 will be turned off and the P-channel transistor MO3 will be turned on. As the gate capacitance is charged up, the transistor MO2 will be turned off and the remainder of the charging is done through the P-channel transistor MO3.

Similarly, during a pull down condition when the data input signal $\overline{D}$ is making a low-to-high transition with the enable signal $\overline{OE}=0$, the second control signal at the output of the second NOR gate 20 will make a low-to-high transition. As a result, the transistor MO7 will be turned on before the transistor MO9 is turned off. This causes the drain of the transistor MO6 to be pulled to the ground potential which biases it in deep saturation. At this point, the P-channel transistor MO8 is still turned off and the N-channel transistor MO7 has a very low impedance. Therefore, the initial charging of the gate capacitance of the pull-down transistor MO10 is done through the N-channel transistor MO7. After the delay by the third inverter 42, the N-channel transistor MO9 will be turned off and the P-channel transistor MO8 will be turned on. As the gate capacitance is charge up, the transistor MO7 will be turned off and the remainder of the charging is done through the P-channel transistor MO8.

Since the noise generated by the transistors in the output stage 14 will increase whenever the temperature decreases, the power supply voltage increases, the channel width increases, the channel length decreases, or the oxide layer thickness decreases, it is necessary to design a reference generator which provides the bias voltage $V_{OB}$ to produce the first and second controlled currents ICH1 and ICH2 that are compensated for these effects. In other words, the controlled currents ICH1 and ICH2 should be designed so as to exhibit the characteristics of an increasing current when the temperature increases, the power supply voltage decreases, the channel width decreases, the channel length increases, or the oxide layer thickness increases. Such a bias voltage $V_{OB}$ has been achieved in the present invention by the reference generator illustrated in FIG. 2 of the drawings.

Figure 2:
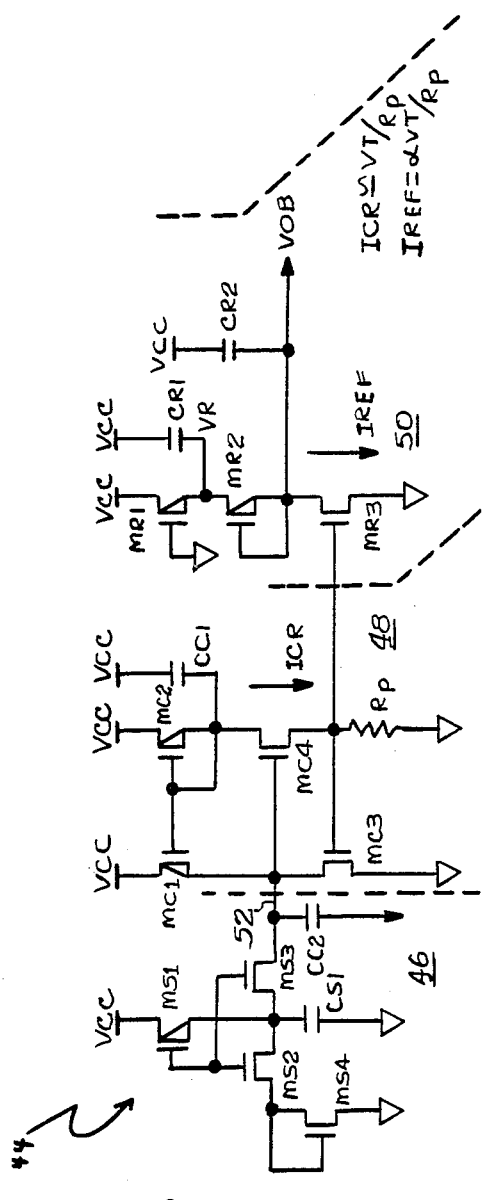
FIG. 2 is a schematic circuit diagram of a reference generator for use with the output buffer circuit arrangement of FIG. 1.

The reference generator 44 of FIG. 2 provides a P-channel gate bias potential $VCC-V_{OB}$ which has a positive temperature coefficient, has a negative power supply gradient and decreases at fast process corners so as to reduce noise at fast bias conditions. The reference generator 44 includes a start-up circuit 46, a VCC-insensitive current generator 48, and a bias voltage generator 50.

The start-up circuit 46 includes a P-channel MOS transistor MS1; three N-channel MOS transistor MS2, MS3 and MS4; and capacitors CS1, CC2. The transistor MS1 has its source connected to a supply voltage or potential VCC and its gate and drain connected together. The gates of the transistors MS2 and MS3 are connected together and to the common gate and drain of the transistor MS1. The gate and drain of transistor MS2 are connected together and are further connected to the gate and source of the transistor MS3. The source of the transistor MS2 is connected to the gate and drain of the transistor MS4. The source of the transistor MS4 is connected to a ground potential. The capacitor CS1 is connected between the common gate and drain of the transistor MS2 and the ground potential. The capacitor CC2 is connected between the drain of the transistor MS3 and the ground potential. The start-up circuit 46 is conventional and is used during power-up (when the power supply is initially turned on) so as to provide a proper output voltage on line 52.

The VCC-insensitive current generator 48 includes a pair of P-channel MOS transistors MC1, MC2 arranged in a current mirror configuration; a pair of N-channel MOS transistors MC3, MC4; a capacitor CC1, and a poly resistor Rp or preferably a resistor with smallest positive temperature coefficient. The sources of the transisors MC1, MC2 are connected to the power supply potential VCC. The gate of the transistor MC1 is connected to the gate and drain of the transistor MC2. The capacitor CC1 is connected between the supply potential and the drain of the transistor MC2 so as to stabilize the current generator under high frequency noise conditions. The drain of the transistor MC1 is connected to the drain of the transistor MC3 and to the gate of the transistor MC4. The gate of the transistor MC4 is also connected to receive the output voltage on the line 52 from the start-up circuit 46. The transistor MC3 has its gate connected to the source of the transistor MC4 and to one end of the resistor Rp. The source of the transistor MC3 and the other end of the resistor Rp are connected to the ground potential. The drain of the transistor MC4 is connected to the common gate and drain of the transistor MC2. The current generator 48 is conventional and is used to produce a power supply insensitive current ICR through the transistor MC4, which is approximately equal to VT(MC3)/Rp. However, the current ICR has a negative temperature coefficient.

The bias voltage generator 50 is specially designed and is used to convert the current ICR to a P-channel gate bias potential $VCC-V_{OB}$ which has a negative power supply gradient, has a positive temperature coefficient, and decreases at fast process corners. The voltage generator 50 is formed of P-channel MOS transistors MR1, MR2; an N-channel MOS transistor MR3; and a capacitor CR2. The transistor MR1 has its source connected to the power supply voltage VCC and its gate connected to the ground potential. Thus, the transistor MR1 functions as a power supply modulated resistor with a negative gradient having a positive temperature coefficient ($dR_{MR1}/dVCC<0$, $dR_{MR1}/dT>0$) The drain of the transistor MR1 is connected to the source of the transistor MR2. Since the gate and drain of the transistor MR2 are connected together, it will function as a diode. The transistor MR3 has its drain connected to the common gate and drain of the transistor MR2, its gate connected to the gate of the transistor MC3, and its source connected to the ground potential.

The reference current IREF flowing through the transistor MR3 will be proportional to the current ICR from the current generator 48 or VT(MC3)/Rp. Since the current through the transistor MR1 will remain independent of the supply potential VCC, the voltage VR at the drain of the transistor MR1 will approach the supply potential VCC at high VCC and similarly, the positive temperature coefficient of $R_{MR1}$ tends to overcome the negative temperature coefficient of IREF (i.e., $VR=VCC-IREF \times R_{MR1}$). Therefore, the P-channel gate bias voltage $VCC-V_{OB}$ has a negative power supply gradient and a positive temperature coefficient. Since the bias potential $VCC-V_{OB}$ is the source-to-gate voltage of transistors MO1 and MO6 in the output buffer 10, the currents ICH1 and ICH2 will also have a negative power supply gradient and a positive temperature coefficient.

The reference generator 44 also provides compensation for process variations. For example, if the N-channel transistors have a low threshold voltage, there will be created a smaller reference current IREF so as to compensate for the fast output transistors MO1 and MO6. If the P-channel transistors are faster, the P-channel gate bias potential $VCC-V_{OB}$ will be lower through the lower impedance of the transistors MR1 and MR2 which yields a lower gate drive so as to compensate for the fast P-channel transistors MO1 and MO6. As a result, the first and second controlled currents ICH1 and ICH2 tend to increase for slow process corners and decrease for fast process corners. It should be noted that certain of the nodes in the start-up circuit 46, current generator 48 and voltage generator 50 are capacitively coupled to the power supply voltage and ground potential so that the current sources ICH1 and ICH2 will remain constant under high frequency noise conditions on the power supply lines.

Figure 3:
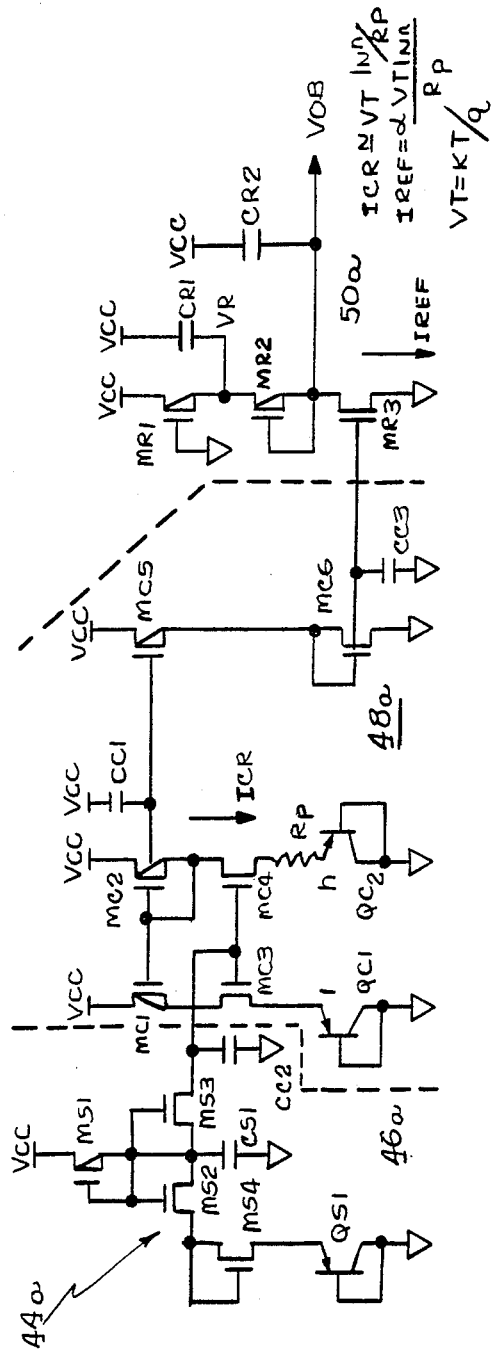
FIG. 3 is a schematic circuit diagram of a second embodiment of a reference generator for use with the output buffer arrangement of FIG. 1.

Referring now to FIG. 3 of the drawings, there is shown a second embodiment of a reference generator 44a which is used to produce the P-channel gate bias voltage $VCC-V_{OB}$. Since the circuit of FIG. 3 is quite similar to the reference generator of FIG. 2, only the differences will be pointed out. As can be seen the start-up circuit 46a has addition of a PNP bipolar transistor QS1 connected as a diode between the source of the transistor MS4 and the ground potential. The VCC-insensitive and temperature-insensitive current generator 48a includes additional PNP bipolar transistors QC1 and QC2 which are diode-connected. The current generator 48a further includes a P-channel MOS transistor MC5 and an N-channel transistor MC6. The bias voltage generator 50a is identical to the one shown in FIG. 2. Except for these differences as pointed out, the circuit of FIG. 3 operates in substantially the same manner so as to produce the bias voltage $V_{OB}$. However, the circuit of FIG. 3 will create a bias voltage $V_{OB}$ which acts more favorably with respect to temperature than the circuit of FIG. 2.

When the output buffer arrangement 10 of FIG. 1 was designed to be matched for speed with conventional output buffers at the slow bias conditions (low power supply voltage and high temperature), the present output buffer yielded a much smaller noise level at the fast bias conditions (high power supply voltage and low temperature). On the other hand, when the present output arrangement was designed to be matched for noise with conventional output buffers at the fast bias conditions, the present output buffer yielded a much higher speed at the slow bias conditions.

From the foregoing detailed description, it can thus be seen that the present invention provides an improved output buffer arrangement for reducing induced chip noise at low temperature, high power supply voltage without degrading substantially its high operational speed. The output buffer arrangement of the present invention includes a first controlled current source, a first bidirectional-switching device for charging the gate of a pull-up transistor in response to the first current source, a second controlled current source, and a second bidirectional-switching device for charging the gate of a pull-down transistor in response to the second current source.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. An output buffer circuit for reducing chip noise at low temperature and high power supply voltage and having a high operational speed, comprising:

an output stage formed of a first N-channel pull-up transistor (MO5) and a second N-channel transistor (MO10), said pull-up transistor (MO5) having its drain connected to a supply potential and its source connected to an output node, said pull-down transistor (MO10) having its drain connected to the output node and its source connected to a ground potential;

first output driver means for generating a first stable, controlled current to charge up the gate of said pull-up transistor (MO5), said first output driver means being formed of first controlled current source means and first bidirectional-switching means;

said first current source means being formed of a first P-channel transistor (MO1) having its source connected to the supply potential and its gate connected to receive a bias voltage;

said first bidirectional-switching means being formed of a first inverter (40), a first CMOS transmission gate, and a third N-channel transistor (MO4);

said first inverter (40) having an input and an output;

said first transmission gate including a fourth N-channel transistor (MO2) and a second P-channel transistor (MO3);

said third N-channel transistor (MO4) having its drain connected to the gate of said first N-channel transistor (MO5), its gate connected to the output of the first inverter (40), and its source connected to ground potential;

said fourth N-channel transistor (MO2) having its drain connected to the source of said second P-channel transistor (MO3) and to the drain of said first P-channel transistor (MO1), said fourth N-channel transistor (MO2) having its source connected to the drain of said second P-channel transistor (MO3), said fourth N-channel transistor (MO2) having its gate connected to the input of said first inverter (40) and to a first control signal, said second P-channel transistor (MO3) having its gate connected to the output of said first inverter (40);

second output driver means for generating a second stable, controlled current to charge up the gate of said pull-down transistor (MO10), said second output driver means being formed of second controlled current source means and second bidirectional-switching means;

said second current source means being formed of a third P-channel transistor (MO6) having its source connected to the supply potential and its gate connected to receive the bias voltage;

said second bidirectional-switching means being formed of a second inverter (42), a second CMOS transmission gate, and a fifth N-channel transistor (MO9);

said second inverter (42) having an input and an output;

said second transmission gate including a sixth N-channel transistor (MO7) and a fourth P-channel transistor (MO8);

said fifth N-channel transistor (MO9) having its drain connected to the gate of said second N-channel transistor (MO10), its gate connected to the output of the second inverter (42), and its source connected to ground potential; and said sixth N-channel transistor (MO7) having its drain connected to the source of said fourth P-channel transistor (MO8) and to the drain of said third P-channel transistor (MO6), said sixth N-channel transistor (MO7) having its source connected to the drain of said fourth P-channel transistor (MO8), said sixth N-channel transistor (MO7) having its gate connected to the input of said second inverter (42) and to a second control signal, said fourth P-channel transistor (MO8) having its gate connected to the output of said second inverter (42).

2. An output buffer circuit as claimed in claim 1, wherein said first stable controlled current from said first current source means is controlled by the bias voltage and has a negative power supply gradient, has a positive temperature coefficient and decreases in value due to fast process corners.

3. An output buffer circuit as claimed in claim 2, wherein said second stable controlled current from said second current source means is controlled by the bias voltage and has a negative power supply gradient, has a positive temperature coefficient and decreases in value due to fast corners.

4. An output buffer circuit as claimed in claim 3, further comprising reference generator means (44) for generating said bias voltage.

5. An output buffer circuit as claimed in claim 4, wherein said reference generator means (44) includes a start-up circuit (46), a power supply voltage-insensitive current generator (48) and bias voltage generator means (50).

6. An output buffer circuit as claimed in claim 5, wherein said bias voltage generator means (50) is responsive to a power supply voltage-insensitive current from said current generator (48) for generating a P-channel gate bias potential which has a negative power supply gradient, has a positive temperature coefficient and decreases in value due to fast process corners.

7. An output buffer circuit as claimed in claim 6, wherein said bias voltage generator means (50) comprises a power supply modulated resistor formed of a P-channel transistor (MR1), a diode formed of a P-channel transistor (MR2) and an N-channel current reference source transistor (MR3), said P-channel transistor (MR1) has its source connected to the power supply potential, its gate connected to the ground potential and its drain connected to the source of the P-channel transistor (MR2), said second P-channel transistor (MR2) having its gate and drain connected together and to the drain of the N-channel transistor (MR3) defining the output of said reference generator, said N-channel transistor (MR3) having its gate connected to receive the power supply voltage-insensitive current from said current generator (48) and its source connected to the ground potential.

8. An output buffer circuit as claimed in claim 7, wherein said power supply voltage-insensitive current from the current generator (48) with a negative temperature coefficient is converted via the modulated resistor with a positive temperature coefficient to the P-channel gate bias potential which has a negative power supply gradient and a positive temperature coefficient.

9. An output buffer circuit as claimed in claim 8, further comprising a capacitor (CR2) connected between the drain of the P-channel transistor (MR2) and the supply potential so as to maintain said stable controlled currents under high frequency noise conditions.

10. In an output buffer circuit for reducing chip noise at low temperature and high power supply voltage and having a high operational speed, comprising:

output stage means (14) including an output transistor (MO5 or MO10);

stable, controlled current source means (MO1 or MO6);

bidirectional-switching means (24 or 27) including a CMOS transmission gate and being responsive to said current source means (MO1 or MO6) for charging the gate of said output transistor (MO5 or MO10);

said current source means being formed of a P-channel transistor having its source connected to a supply potential, its gate connected to a bias voltage and its drain connected to said bidirectional-switch means; and said current source means providing a stable controlled current (ICH1 or ICH2) which is controlled by the bias voltage and has a negative power supply gradient, has a positive temperature coefficient and decreases in value due to fast process corners.

11. In an output buffer circuit as claimed in claim 10, further comprising reference generator means (44) for generating said bias voltage.

12. In an output buffer circuit as claimed in claim 11, wherein said reference generator means (44) includes a start-up circuit (46), a power supply voltage-insensitive current generator (48) and bias voltage generator means (50).

13. In an output buffer circuit as claimed in claim 12, wherein said bias voltage generator means (50) is responsive to a power supply voltage-insensitive current from said current generator (48) for generating a P-channel gate bias potential which has a negative power supply gradient, has a positive temperature coefficient and decreases in value due to fast process corners.

14. In an output buffer circuit as claimed in claim 13, wherein said bias voltage generator means comprises a power supply modulated resistor formed of a P-channel transistor (MR1), a diode formed of a P-channel transistor (MR2) and an N-channel current reference source transistor (MR3), said P-channel transistor (MR1) has its source connected to the power supply potential, its gate connected to the ground potential and its drain connected to the source of the P-channel transistor (MR2), said second P-channel transistor (MR2) having its gate and drain connected together and to the drain of the N-channel transistor (MR3) defining the output of said reference generator, said N-channel transistor (MR3) having its gate connected to receive the power supply voltage-insensitive current from said current generator (48) and its source connected to the ground potential.

15. In an output buffer circuit as claimed in claim 14, wherein said power supply voltage-insensitive current from the current generator (48) with a negative temperature coefficient is converted via the modulated resistor with a positive temperature coefficient to the P-channel gate bias potential which has a negative power supply gradient and a positive temperature coefficient.

16. In an output buffer circuit as claimed in claim 15, further comprising a capacitor (CR2) connected between the drain of the P-channel transistor (MR2) and the supply potential so as to maintain said stable controlled current under high frequency noise conditions.

17. A reference generator for generating a P-channel gate bias potential which has a negative power supply gradient and has a positive temperature coefficient, said reference generator comprising:

current generator means (48) for generating a power supply voltage-insensitive current (ICR) which has a negative temperature coefficient;

a first P-channel transistor (MR1) having its source connected to a power supply potential and its gate connected to a ground potential;

a second P-channel transistor (MR2) having its source connected to the drain of said first P-channel transistor (MR1);

said second P-channel transistor (MR2) having its gate and drain connected together and to an output node defining the output of said reference generator; and an N-channel current reference source transistor (MR3) having its drain connected to the output node, its gate connected to receive a voltage which is proportional to the power supply voltage-insensitive current (ICR) from said current generator means (48), and its source connected to a ground potential.

* * * * *